(12) United States Patent
Ockwell et al.

(10) Patent No.: US 9,366,973 B2
(45) Date of Patent: Jun. 14, 2016

(54) LITHOGRAPHIC APPARATUS AND DEVICE MANUFACTURING METHOD

(75) Inventors: David Christopher Ockwell, Waalre (NL); Noud Jan Gilissen, 's-Gravenzande (NL)

(73) Assignee: ASML Netherlands B.V., Veldhoven (NL)

( * ) Notice: Subject to any disclaimer, the term of this patent is extended or adjusted under 35 U.S.C. 154(b) by 289 days.

(21) Appl. No.: 13/983,203

(22) PCT Filed: Dec. 20, 2011

(86) PCT No.: PCT/EP2011/073356
§ 371 (c)(1),
(2), (4) Date: Aug. 1, 2013

(87) PCT Pub. No.: WO2012/110144
PCT Pub. Date: Aug. 23, 2012

(65) Prior Publication Data
US 2013/0321788 A1    Dec. 5, 2013

Related U.S. Application Data

(60) Provisional application No. 61/444,148, filed on Feb. 18, 2011.

(51) Int. Cl.
*G03F 7/20* (2006.01)
*H01H 13/83* (2006.01)
(Continued)

(52) U.S. Cl.
CPC ........ *G03F 7/70708* (2013.01); *G03F 7/70733* (2013.01); *H01H 13/704* (2013.01);
(Continued)

(58) Field of Classification Search
CPC . G03F 7/70708; G03F 7/707; G03F 7/70716; G03F 7/70733; H01L 21/683; H01L 21/6831; H01L 21/682
See application file for complete search history.

(56) References Cited

U.S. PATENT DOCUMENTS 4,506,184 A    3/1985  Siddall
4,666,291 A *  5/1987  Taniguchi ............... G03F 7/703
                                                          355/52
(Continued)

FOREIGN PATENT DOCUMENTS

JP    H09-237827 A    9/1997
JP    2005-045259 A   2/2005
(Continued)

OTHER PUBLICATIONS

International Search Report directed to related International Patent Application No. PCT/EP2011/073356, mailed Jun. 12, 2012; 2 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

A substrate support is provided for a lithographic apparatus. The support comprises a substrate table constructed to hold a substrate and a chuck for the substrate table. In operation, the substrate table is supported by the chuck and clamped thereto. The substrate support comprises a first set of burls on a surface of the support block for abutting against the substrate table during the clamping and a second set of burls on a surface of the substrate table for abutting against the support block during the clamping.

18 Claims, 3 Drawing Sheets

(51) Int. Cl.
 H01H 13/704 (2006.01)
 H01H 13/7065 (2006.01)
 H01H 3/12 (2006.01)
 H01H 13/86 (2006.01)

(52) U.S. Cl.
 CPC ........... H01H13/7065 (2013.01); H01H 13/83 (2013.01); *H01H 3/125* (2013.01); *H01H 13/86* (2013.01); *H01H 2219/036* (2013.01); *H01H 2219/064* (2013.01); *H01H 2221/03* (2013.01); *H01H 2223/036* (2013.01); *H01H 2227/028* (2013.01); *Y10T 29/49826* (2015.01)

(56) References Cited

U.S. PATENT DOCUMENTS

| | | | |
|---|---|---|---|
| 6,864,957 B2* | 3/2005 | Van Elp | G03F 7/707 355/53 |
| 7,110,091 B2 | 9/2006 | Zaal et al. | |
| 2004/0130692 A1 | 7/2004 | Tanaka et al. | |
| 2005/0030512 A1 | 2/2005 | Maria Zaal et al. | |
| 2005/0061995 A1 | 3/2005 | Vink et al. | |
| 2006/0102849 A1* | 5/2006 | Mertens | G03F 7/707 250/440.11 |
| 2009/0044837 A1 | 2/2009 | Tanaka et al. | |
| 2009/0079525 A1* | 3/2009 | Sijben | G03F 7/70708 335/72 |
| 2009/0290139 A1 | 11/2009 | Van Der Sijs et al. | |
| 2010/0085551 A1 | 4/2010 | Vermeulen et al. | |
| 2011/0013164 A1 | 1/2011 | Nayfeh et al. | |

FOREIGN PATENT DOCUMENTS

| | | |
|---|---|---|
| JP | 2007-053405 A | 3/2007 |
| WO | WO 2009/002577 | 12/2008 |
| WO | WO 2009/036995 A1 | 3/2009 |

OTHER PUBLICATIONS

International Preliminary Report on Patentability and Written Opinion of the International Searching Authority directed to related International Patent Application No. PCT/EP2011/073356, issued Aug. 21, 2013; 7 pages.

* cited by examiner

LITHOGRAPHIC APPARATUS AND DEVICE MANUFACTURING METHOD

CROSS-REFERENCE TO RELATED APPLICATIONS

This application claims the benefit of U.S. provisional application 61/444,148, which was filed on 18 Feb. 2011, and which is incorporated herein in its entirety by reference.

BACKGROUND

1. Field of the Present Invention

The present invention relates to a lithographic apparatus and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In a lithographic apparatus, in order to project the image of the patterning device on different target portions of the substrate and to scan the substrate using the projection system, the substrate is moved. This is done by an arrangement comprising what is known as a chuck (which may comprise a mirror block) and which carries a substrate table (also called wafer table). The chuck is moveable by a positioning system. The chuck transfers its movements via the substrate table to the substrate.

The substrate table is clamped by vacuum or electrostatically to the chuck (also called encoder block) via burls. A higher throughput of the lithographic projection apparatus can be achieved by faster movements of the substrate underneath the projection system. The faster movements will be achieved by higher accelerations which may cause (local) slip between the chuck and the substrate table. Slip between the chuck and the substrate table may lead to the substrate being at another position than previous determined and therefore to wrongly exposed substrates.

SUMMARY

It is desirable to avoid a (local) slip between the mirror block and the substrate table.

According to an aspect of the present invention, there is provided a substrate support for a lithographic apparatus comprising: a substrate table constructed to hold a substrate; and a support block for the substrate table; wherein in operation the substrate table is supported by the support block and clamped thereto; and an array of elongate elements are provided on a surface of the support block for abutting against the substrate table during the clamping; and a set of burls are provided on a surface of the substrate table for abutting against the support block during the clamping; wherein the distance between the surface from which the array of elongate elements extend and the surface from which the set of burls extend is defined by the sum of the heights of the array of elongate elements and of the set of burls, measured from the respective surfaces from which they extend.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
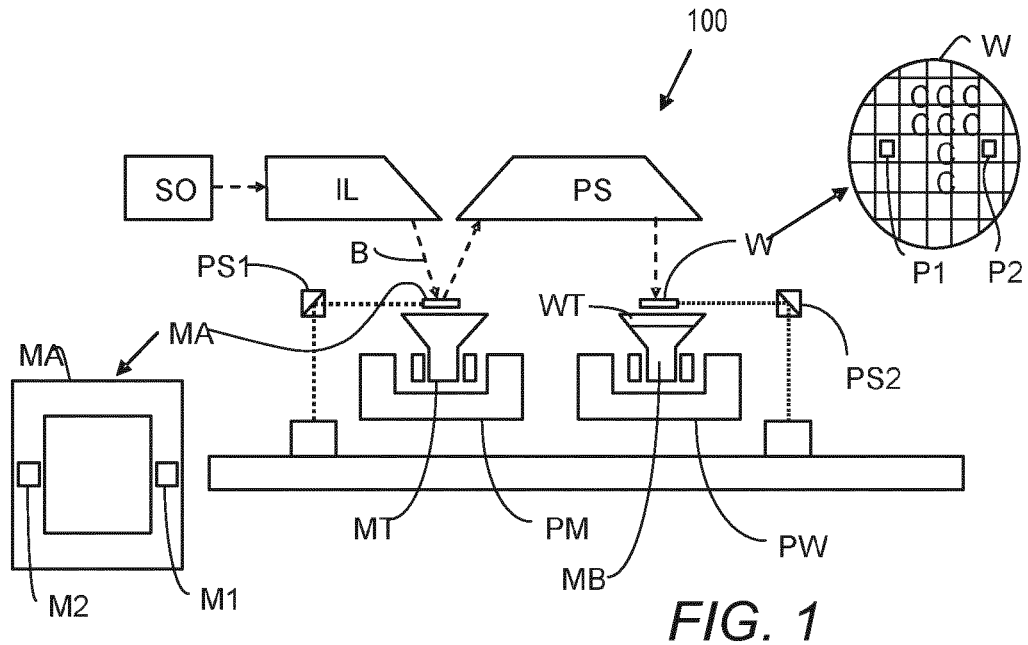
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 100 including a source collector module SO according to one embodiment of the present invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a chuck, which may be a mirror block MB (also called encoder block) and provided with a substrate table (e.g., a wafer table) WT constructed to hold a substrate (e.g., a resist-coated wafer) W and connected to a second positioner PW configured to accurately position the substrate, and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
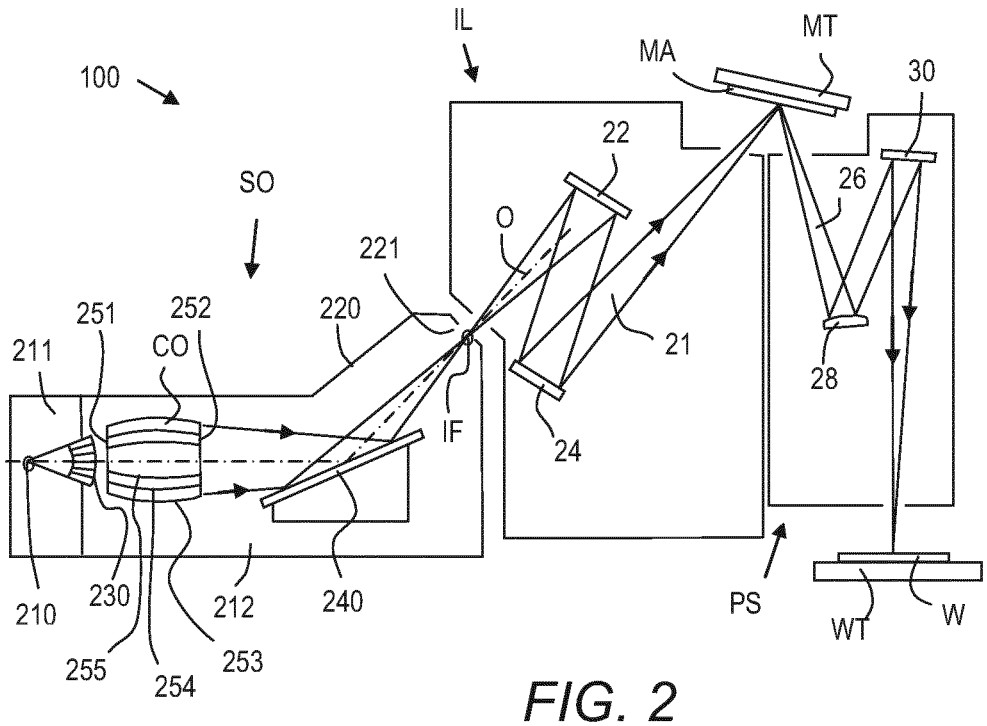
FIG. 2 is a more detailed view of the apparatus in FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
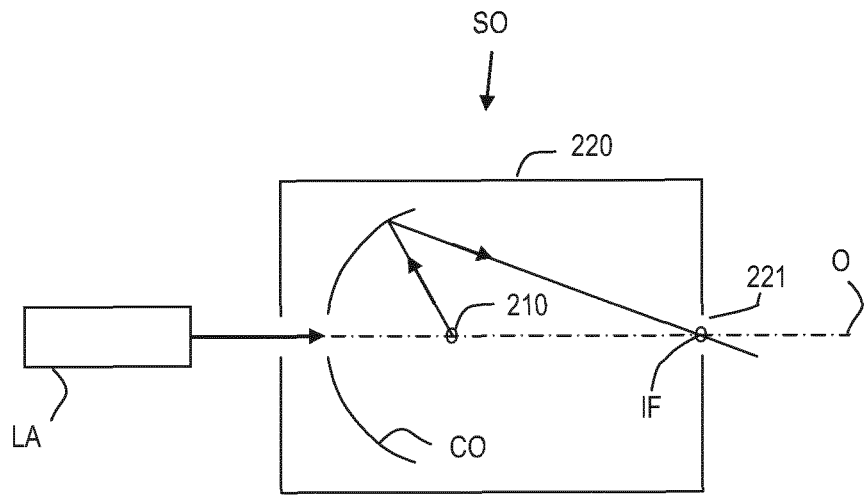
FIG. 3 is a more detailed view of the source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Note that the mirror block MB, as stated above, comprises the substrate table WT. However, when the substrate table is discussed in relation to the main part of the mirror block (the main part of the mirror block is the mirror block without the substrate table) and when there is no risk of confusion then the term mirror block is used to refer only to the main part. The mirror block of the embodiments described may also be generalised to any type of chuck or wafer table support.

One type of known wafer table clamp arrangement is the vacuum clamp, in which the wafer table is clamped to its supporting chuck and the wafer is clamped to the wafer table using a vacuum. These clamps are provided with long burls, perhaps 1 mm or more long, on the underside of the wafer table surface, so as to provide some lateral elasticity and/or flexibility between the wafer table and chuck. The reason for this is that the wafer table is subject to large lateral acceleration forces during the lithography process, which are exerted by the second positioning device on the chuck. These acceleration forces may cause local deformation of the chuck with respect to the substrate table, resulting in slip between the chuck and the substrate table. Therefore long burls, having increased flexibility, may be provided between the chuck and the substrate table to reduce this slip. The areas of the chuck where the second positioning device is connected to the substrate table may suffer from the largest deformations caused by the second positioning device. The increased flexibility makes it possible for the burls to absorb a part of the deformation without slipping, which provides significant benefits and superior properties in terms of reduction of slip between the chuck and the substrate table.

Another type of clamp is the electrostatic clamp. These tend not to be subjected to such large accelerations and therefore do not tend to be provided with long burls.

Figure 4A:
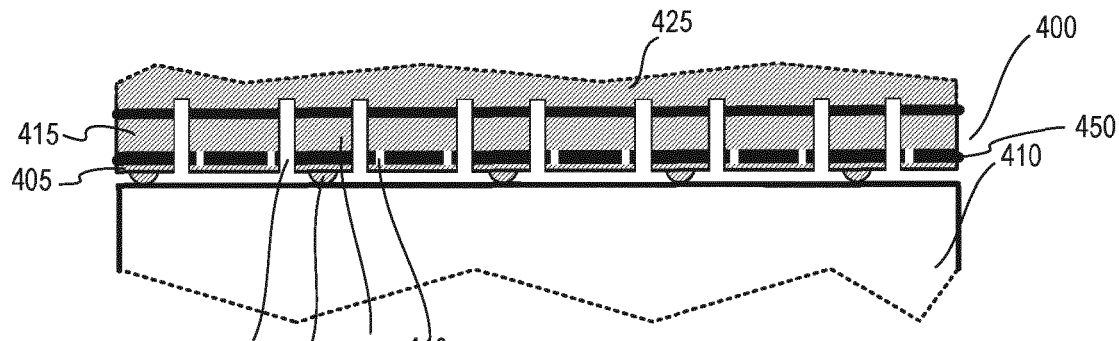
FIGS. 4a and 4b show embodiments of mirror block arrangements.

FIG. 4a shows a possible electrostatic clamp arrangement, able to withstand the large lateral accelerations that vacuum clamps are subjected. It shows the lower part of an electrostatic clamp 400 and an upper part of mirror block 410. The electrostatic clamp 400 comprises first glass layer 405 and second glass layer 415 with a core material layer 425 above this, and forms part of the substrate table. The bonding layer 450 between the first and second glass layers forms the clamping electrode. The clamp is provided with long burls 430 formed on its underside. These long burls 430 themselves have short burls 420 on their underside to further reduce the overall contact area between the electrostatic clamp 400 and mirror block 410 surfaces, these long burls 430 formed by etching/drilling of a channel 435. These short burls 420 act to reduce the impact of any contaminants which may find their way between the two surfaces.

The provision of such long burls 430 is for the same reasons described above in relation to the vacuum clamp.

Figure 4B:
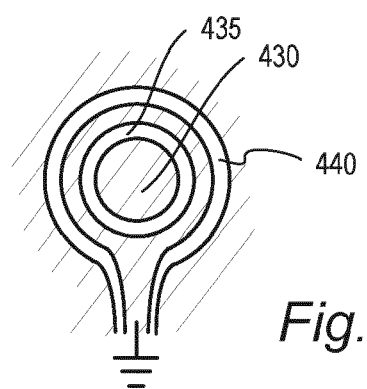

A drawback with this arrangement is that the glass layers 405, 415 need to be drilled through, resulting in manufacturing complexity. This complexity is exacerbated by the fact that the drilling channels 435 made to form the burls means that the electrode bonding layer 450 is exposed to the vacuum of the lithography chamber locally around each burl. The vacuum typically used for EUV lithography is means that unwanted arcing can be a problem. Therefore a gap 440 is formed in the high voltage electrode bonding layer 450 around each the drilling channel 435, thereby isolating the exposed sections of the metal electrode bonding layer 450 from the high voltage. Additionally, the isolated exposed sections of the bonding layer are also required to be individually grounded. This is shown more clearly on FIG. 4b which shows a cross section of a single burl 430 through the bonding layer 450.

Figure 5A:
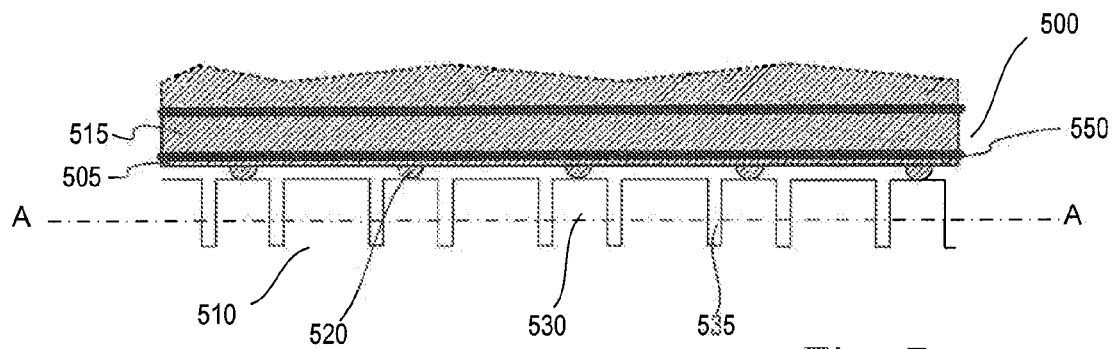
FIGS. 5a and 5b show a mirror block arrangement according to an embodiment of the present invention.
Figure 5B:
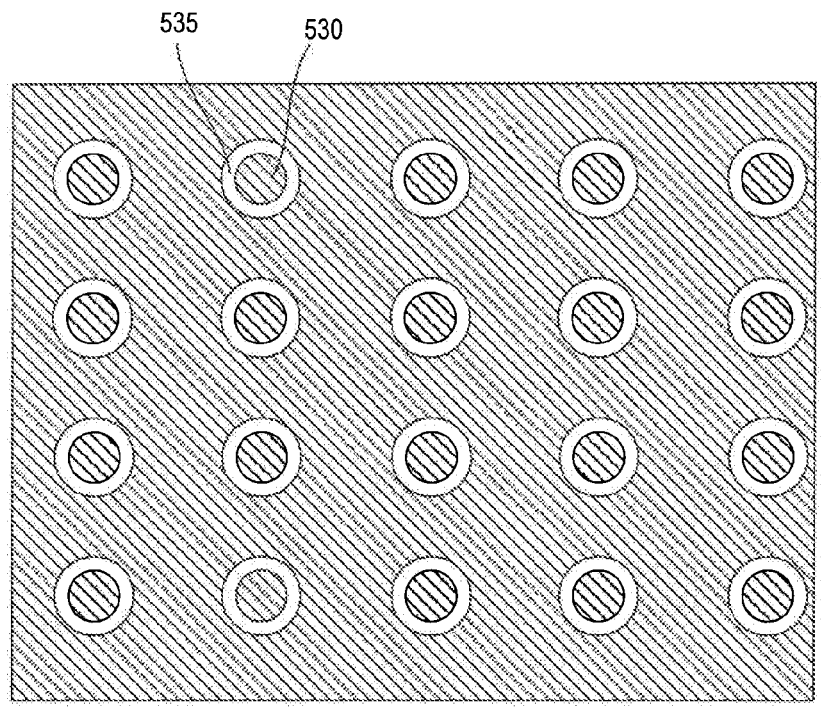

FIGS. 5a and 5b shows a wafer stage arrangement according to an embodiment of the present invention. FIG. 5a shows an electrostatic clamp 500 and an upper part of mirror block 510. The electrostatic clamp 500 comprises short burls 520 on its underside to reduce the overall contact area between the electrostatic clamp 500 and mirror block 510 surfaces, so as to reduce the impact of any contaminants which may find their way between the two surfaces, as with the example of FIG. 4. The top surface of the mirror block 510 comprises long burls 530 to reduce slip between the mirror block and the substrate table as discussed above, and may be covered with a metal conducting layer in between burls. The long burls may be 1 mm or more tall while the short burls may be less than 100 μm tall.

The bonding layer 550 between first glass layer 505 and second glass layer 515, as before, forms the clamping electrode. However, this time it is an unbroken continuous layer as there is no need for individual grounding around each burl 530 as the electrode is now no longer exposed to the vacuum at each burl 530. This makes the clamp 500 much simpler to manufacture. The height of the short burls (not shown) on the wafer table, along with the first glass layer 505 sets the electrostatic gap and, together with the voltage applied, the clamping force.

As can be seen better from FIG. 5b, which shows a cross section through line AA of FIG. 5a, each of the long burls 530 may be manufactured by removing a cylindrical plug from the mirror block 510 surface. This forms a cylindrical channel 535 and leaves the burls 530 top level, with the original mirror block 510 surface remaining between the burls 530. This has the advantage of utilizing the usual machining capabilities of mirror block manufacturers.

Furthermore, the short burls 520 on the electrostatic clamps can be made using existing processing capabilities (etching) of wafer table manufacturers. There is no need to drill through multiple layers of bonded glass as with the device of FIG. 4. The burl height together with the lower layer glass thickness sets the clamping force. This is testable by the table supplier. Therefore, the provision of long burls on the mirror block and short burls on the table means that, in both cases, the burls can be made using 'machining' operations rather than deep etching, these processes already being standard at mirror block and wafer table suppliers.

Although the above embodiments are described in relation to electrostatic clamps in particular, the concepts described are equally applicable to other types of clamps such as vacuum clamps, and the mirror block may comprise any other type of chuck.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A substrate support for a lithographic apparatus comprising:
   a substrate table constructed to hold a substrate;
   a support block for the substrate table; wherein in operation the substrate table is supported by the support block and clamped thereto;
   an array of elongated elements on a surface of the support block for abutting against the substrate table during the clamping; and
   a set of burls are provided on a surface of the substrate table for abutting against the support block during the clamping,
   wherein the substrate table comprises an electrostatic clamp and the clamping of the substrate table to the support block is performed electrostatically, and
   wherein a top surface of the support block comprises a metal conducting layer between elongate elements, such that the electrostatic gap is defined by the sum of the height of the set of burls, measured from the surface from which the burls extend, and the height of a first glass layer between the clamping electrode and the set of burls.

2. The substrate support as claimed in claim 1 wherein an electrode of the electrostatic clamp comprises a single continuous conducting layer.

3. The substrate support of claim 1 wherein the array of elongate elements are 10 or more times taller than the set of burls, when measured from the surface from which they extend.

4. The substrate support of claim 1 wherein the array of elongate elements are 100 or more times taller than the set of burls.

5. The substrate support of claim 1 wherein the array of elongate elements are each over 0.5 mm tall, so as to minimize slip between the substrate table and support block during lateral acceleration of the substrate support.

6. The substrate support claim 1 wherein the set of burls are each under 100 µm tall.

7. The substrate support of claim 1 wherein the support block comprises a mirror block.

8. The substrate support of claim 1 wherein the set of burls are configured to minimize the contact area between substrate table and support block during clamping.

9. The substrate support of claim 1 wherein the array of elongate elements comprises a machined surface of the support block.

10. A lithographic apparatus comprising:
- an illumination system configured to condition a radiation beam;
- a support constructed to support a patterning device, the patterning device being capable of imparting the radiation beam with a pattern in its cross-section to form a patterned radiation beam; and
- a projection system configured to project the patterned radiation beam onto a target portion of the substrate, and a substrate support, wherein the substrate support comprises:
  - a substrate table constructed to hold a substrate;
  - a support block for the substrate table; wherein in operation the substrate table is supported by the support block and clamped thereto;
  - an array of elongated elements on a surface of the support block for abutting against the substrate table during the clamping; and
  - a set of burls are provided on a surface of the substrate table for abutting against the support block during the clamping,
  - wherein the substrate table comprises an electrostatic clamp and the clamping of the substrate table to the support block is performed electrostatically, and
  - wherein a top surface of the support block comprises a metal conducting layer between elongate elements, such that the electrostatic gap is defined by the sum of the height of the set of burls, measured from the surface from which the burls extend, and the height of a first glass layer between the clamping electrode and the set of burls.

11. The lithographic apparatus as claimed in claim 10, wherein an electrode of the electrostatic clamp comprises a single continuous conducting layer.

12. The lithographic apparatus of claim 10, wherein the array of elongate elements are 10 or more times taller than the set of burls, when measured from the surface from which they extend.

13. The lithographic apparatus of claim 10, wherein the array of elongate elements are 100 or more times taller than the set of burls.

14. The lithographic apparatus of claim 10, wherein the array of elongate elements are each over 0.5 mm tall, so as to minimize slip between the substrate table and support block during lateral acceleration of the substrate support.

15. The lithographic apparatus claim 10, wherein the set of burls are each under 100 µm tall.

16. The lithographic apparatus of claim 10, wherein the support block comprises a mirror block.

17. The lithographic apparatus of claim 10, wherein the set of burls are configured to minimize the contact area between substrate table and support block during clamping.

18. The lithographic apparatus of claim 10, wherein the array of elongated elements comprises a machined surface of the support block.

* * * * *